(12) United States Patent
Ueno et al.

(10) Patent No.: US 7,751,660 B2
(45) Date of Patent: Jul. 6, 2010

(54) OPTOELECTRIC COMPOSITE WIRING MODULE AND INFORMATION PROCESSING APPARATUS

(75) Inventors: Osamu Ueno, Kanagawa (JP); Kazuhiro Sakai, Kanagawa (JP); Shinya Kyozuka, Kanagawa (JP); Osamu Ohtani, Kanagawa (JP); Akira Tateishi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 480 days.

(21) Appl. No.: 11/805,360

(22) Filed: May 23, 2007

(65) Prior Publication Data

US 2008/0152286 A1    Jun. 26, 2008

(30) Foreign Application Priority Data

Dec. 22, 2006  (JP) .......................... P.2006-345835

(51) Int. Cl.
*G02B 6/12* (2006.01)
(52) U.S. Cl. .............................. 385/14; 385/15; 385/31
(58) Field of Classification Search ................... 385/14, 385/129, 15, 31
See application file for complete search history.

(56) References Cited

U.S. PATENT DOCUMENTS

| | | | |
|---|---|---|---|
| 6,970,610 B2 | 11/2005 | Iwasaki | |
| 7,130,511 B2 * | 10/2006 | Riester et al. | 385/101 |
| 2003/0179978 A1 | 9/2003 | Iwasaki | |
| 2005/0220393 A1 * | 10/2005 | Riester et al. | 385/15 |

FOREIGN PATENT DOCUMENTS

| | | |
|---|---|---|
| JP | 6-308519 | 11/1994 |
| JP | 2003-279770 | 10/2003 |
| JP | 2005-4014 | 1/2005 |
| JP | 2005-134577 | 5/2005 |
| JP | 2005-317658 | 11/2005 |
| JP | 2006-39151 | 2/2006 |
| JP | 2006-42307 | 2/2006 |
| JP | 2006-91241 | 4/2006 |
| JP | 2006-91500 | 4/2006 |
| JP | 2006-127989 | 5/2006 |
| JP | 2006-140233 | 6/2006 |

* cited by examiner

*Primary Examiner*—Sarah Song
(74) *Attorney, Agent, or Firm*—Fildes & Outland, P.C.

(57) ABSTRACT

An optoelectric composite wiring module includes: a pair of optical circuit sections, each including an optical element that performs photoelectric conversion and that receives or outputs an optical signal; an optical wiring section including an optical wiring that transmit the optical signal between the pair of optical circuit sections; and an electric wiring section including an electric wiring that transmits an electric power or electric signal that is not related to the photoelectric conversion, the electric wiring section including a first portion being stacked above the optical wiring section and a second portion being separated from and not stacked above each of the pair of optical circuit sections.

12 Claims, 13 Drawing Sheets

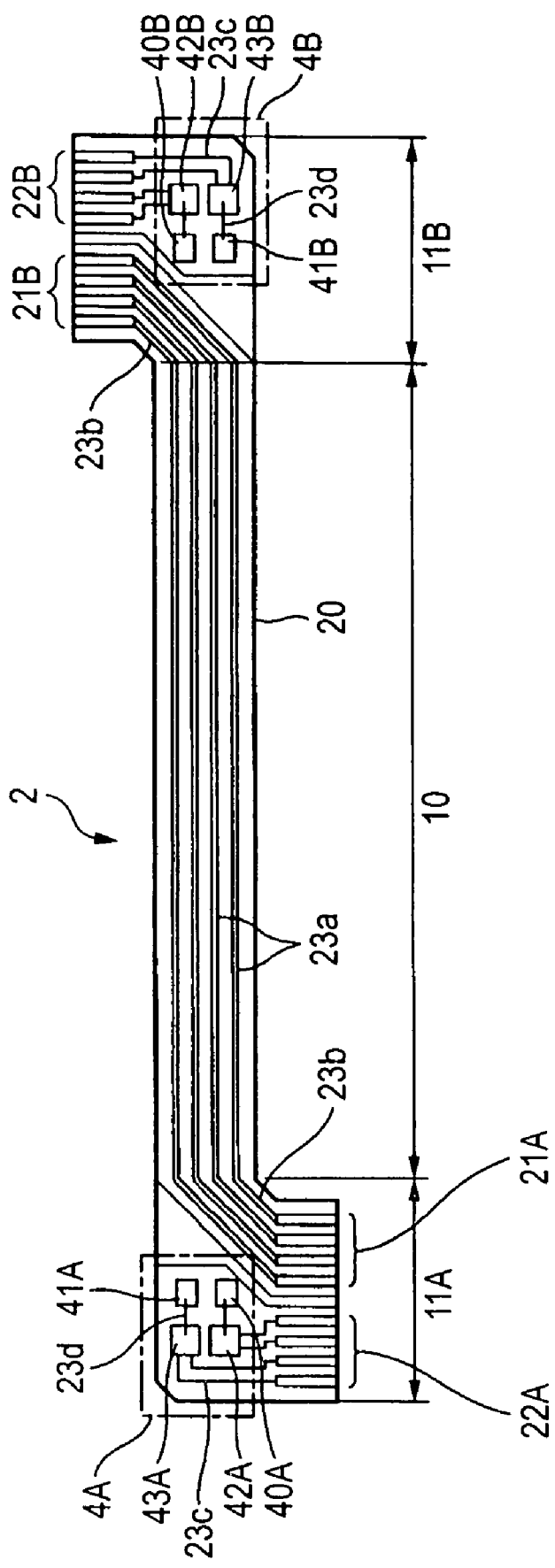

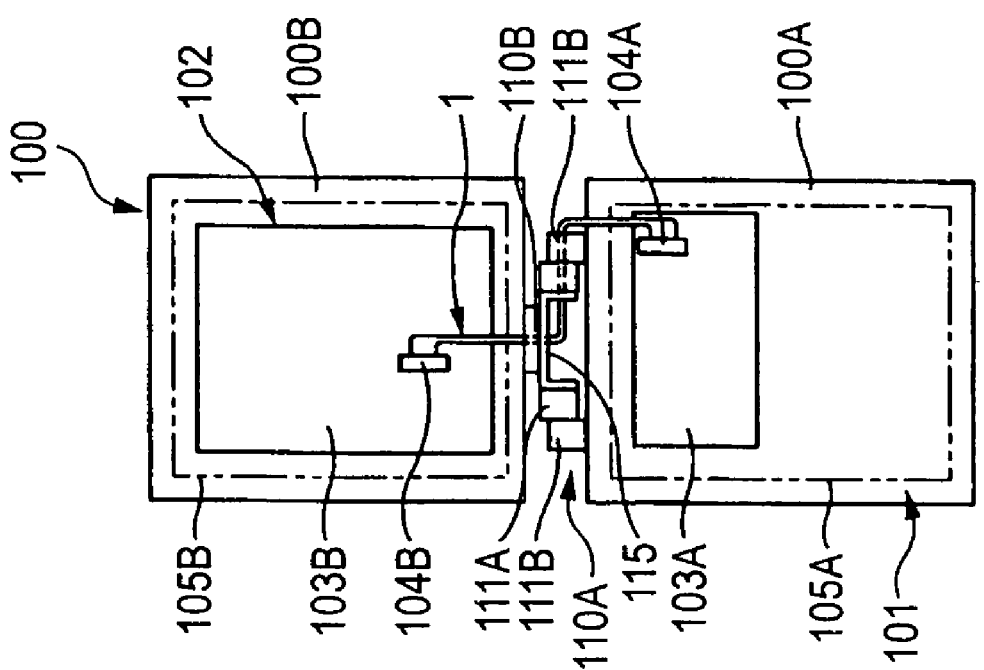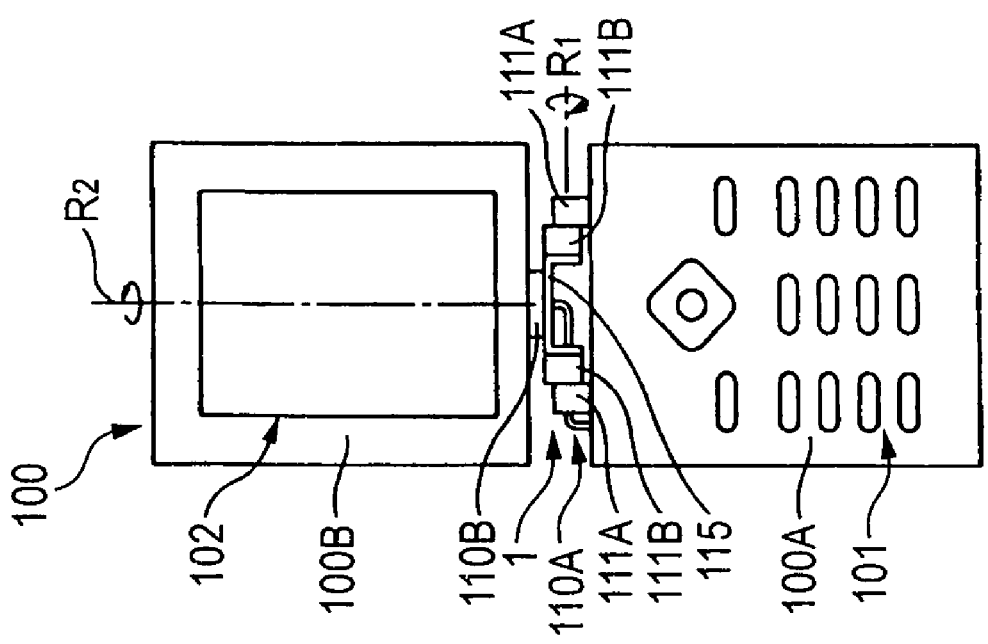

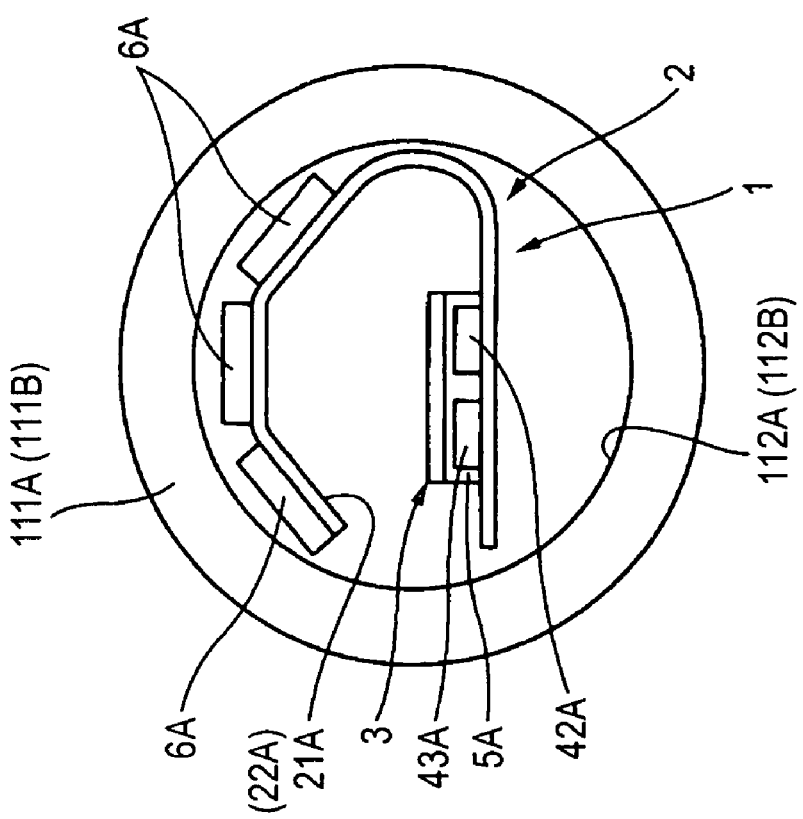
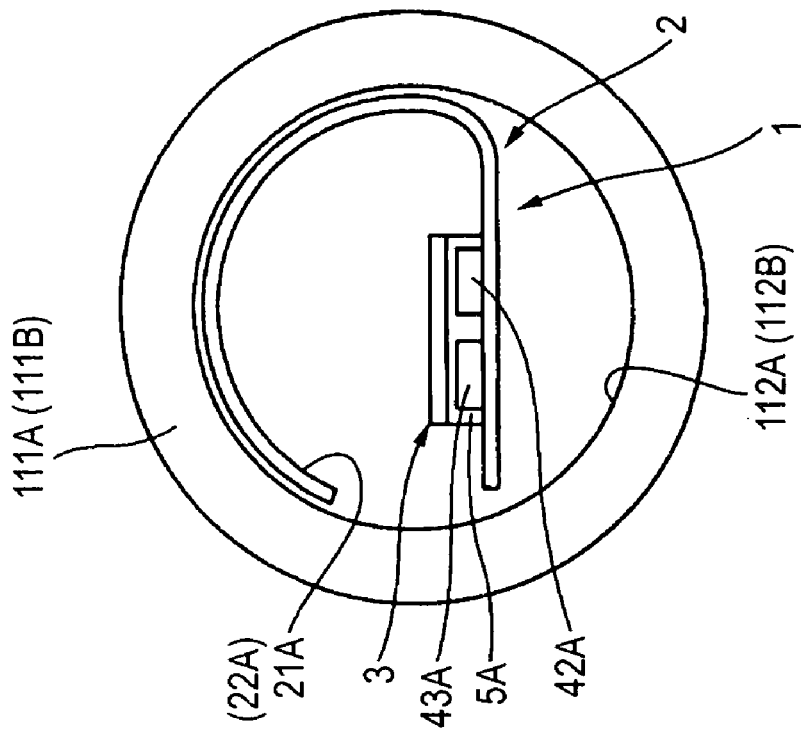

US 7,751,660 B2

OPTOELECTRIC COMPOSITE WIRING MODULE AND INFORMATION PROCESSING APPARATUS

CROSS-REFERENCE TO RELATED APPLICATION

This application is based on and claims priority under 35 USC §119 from Japanese Patent Application No. 2006-345835 filed Dec. 22, 2006.

BACKGROUND (i) Technical Field

The present invention relates to an optoelectric composite wiring module and an information processing apparatus.

(ii) Related Art

Recently, for an information processing apparatus such as a cellular phone, a personal computer or a PDA (Personal Digital Assistant), and in accordance with an increase in the transmission capacity of handling signals, an optoelectric composite wiring module employing an optical wiring as part of the internal wiring thereof has been proposed.

SUMMARY

According to an aspect of the invention, there is provided an optoelectric composite wiring module comprising:

a pair of optical circuit sections, each including an optical element that performs photoelectric conversion and that receives or outputs an optical signal;

an optical wiring section including an optical wiring that transmit the optical signal between the pair of optical circuit sections; and an electric wiring section including an electric wiring that transmits an electric power or electric signal that is not related to the photoelectric conversion, the electric wiring section including a portion being stacked above the optical wiring section and a second portion being separated from and not stacked above each of the pair of optical circuit sections.

BRIEF DESCRIPTION OF THE DRAWINGS

Embodiments of the present invention will be described in detail based on the following figures, wherein:

FIG. 2 is a plan view of the optoelectric composite wiring module shown in FIG. 1, without an optical waveguide;

FIG. 9A is a front view of a cellular phone according to a fifth exemplary embodiment of the present invention, FIG. 9B is a rear view of the cellular phone.

FIGS. 10A and 10B are diagrams for explaining a method for inserting an optoelectric composite wiring module through holes of hinge cylinders;

DETAILED DESCRIPTION

An optoelectric composite wiring module according to an exemplary embodiment of the present invention includes: a pair of optical circuit sections, each including an optical element that performs photoelectric conversion and that receives or outputs an optical signal; an optical wiring section including an optical wiring that transmit the optical signal between the pair of optical circuit sections; and an electric wiring section including an electric wiring that transmits an electric power or electric signal that is not related to the photoelectric conversion, the electric wiring section being stacked above the optical wiring section and being separated from and not stacked above each of the pair of optical circuit sections.

Examples of the "optical wiring section" include an optical waveguide or optical fiber and may include one or two or more optical wirings, which are not especially limited in number. Examples of the "electric wiring section" include: a flexible, printed wiring board having a conductive pattern on either a surface or back surface or an intermediate layer of an insulating member layer; and a coaxial or flat cable, and the number of electric wirings is not limited. Examples of the "optical element" include a light emitting element that is an electro-photo converter, and a light receiving element that is a photoelectric converter, and optical elements equivalent in number to the number of optical wirings are arranged at respective ends of the optical wirings. Either a light emitting element and a light receiving element, or one or plural light emitting elements, or one or plural light receiving elements are employed as an optical element combination to be arranged for one pair of optical circuit sections. Examples of the "optical circuit section" includes drive circuit for driving light emitting elements, and amplification circuits for amplifying signals output by light receiving elements, as needed. Furthermore, in this specification, "stacked" is applied not only in a case wherein the optical wiring section and the electric wiring section are arranged horizontally, but also in cases wherein these sections are arranged either vertically or obliquely.

First Embodiment

Figure 1:
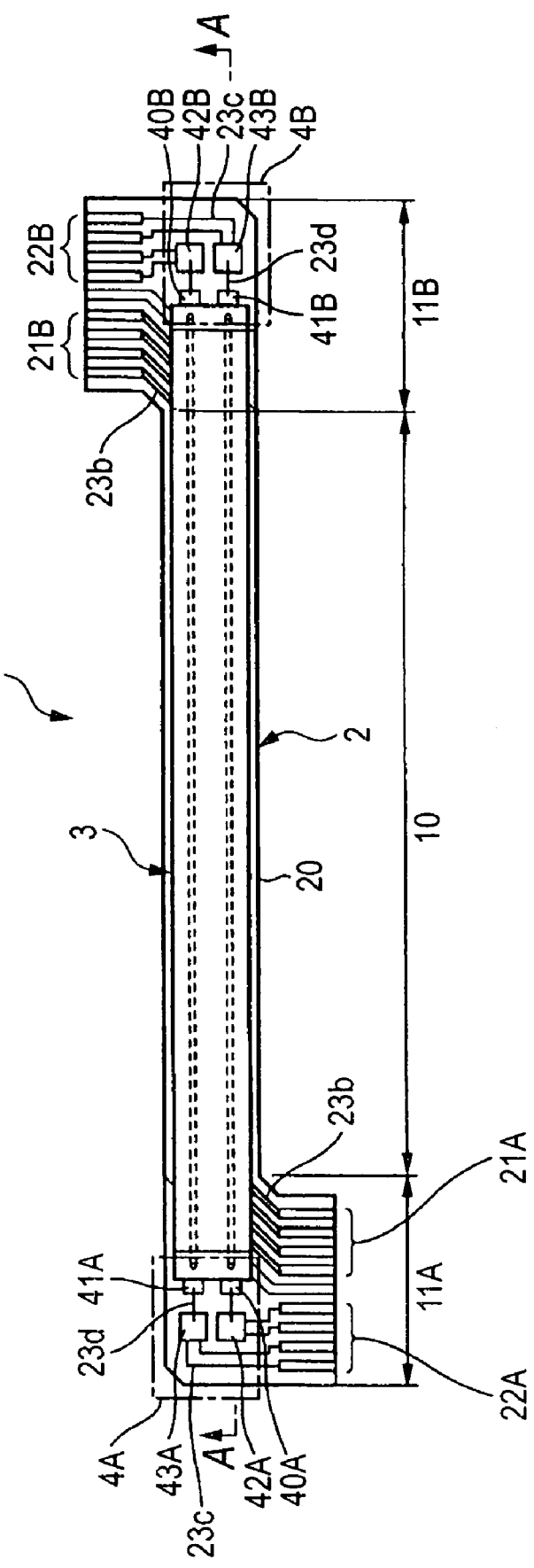
FIG. 1 is a plan view of an optoelectric composite wiring module according to a first exemplary embodiment of the present invention.
Figure 3A:
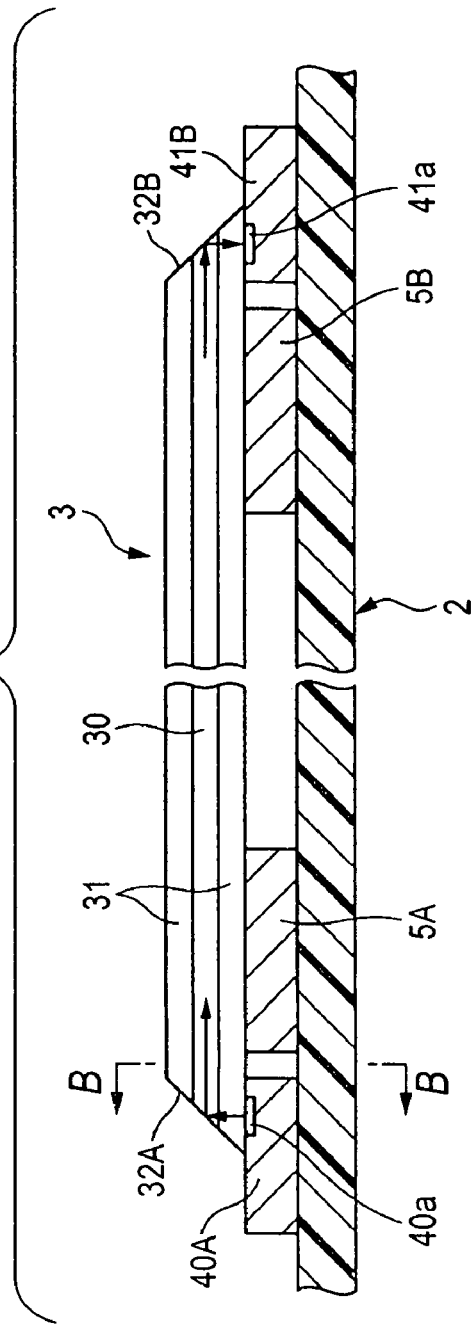
FIG. 3A is a cross-sectional view taken along A-A in FIG. 1.
Figure 3B:
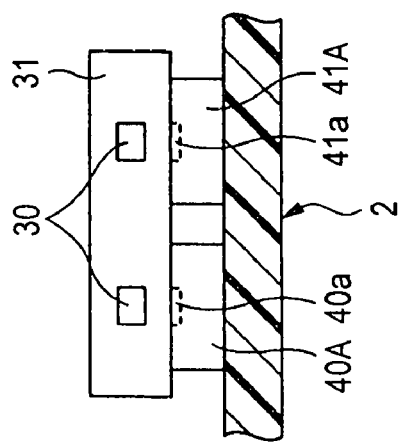
FIG. 3B is a cross-sectional view taken along B-B in FIG. 1.

FIG. 1 is a plan view of an optoelectric composite wiring module according to a first exemplary embodiment of the present invention. FIG. 2 is a plan view of the optoelectric composite wiring module in FIG. 1 from which an optical waveguide has been removed. FIG. 3A is a cross-sectional view taken along line A-A in FIG. 1, and FIG. 3B is a cross-sectional view taken along line B-B in FIG. 1.

As shown in FIG. 1, an optoelectric composite wiring module 1 includes: a flexible, printed wiring board (hereinafter referred to as an "FPC") 2; and an optical waveguide (optical wiring section) 3, which is arranged above the FPC 2 having a gap by being stacked on bases 5A and 5B. Further, in the optoelectric composite wiring module 1, the optical waveguide 3 and the portion of the FPC 2 above which the optical waveguide 3 is stacked provide a wiring section 10, and at each end of the wiring section 10 is one unit of a pair of terminal units 11A and 11B.

The bases 5A and 5B are formed of a resin, such as an epoxy resin, and are adhered to the FPC 2 and the optical waveguide 3. A gap due to the based SA and 5B is defined between the FPC 2 and the optical waveguide 3; however, an adhesive may be used to directly fix the optical waveguide to the FPC 2.

(FPC)

As shown in FIGS. 1 and 2, the FPC 2 includes an insulating board member 20 made of an insulating material, such as a polyimide resin. Formed on the surface of one terminal unit 11A of the insulating board member 20 are an optical circuit section 4A, a plurality of external connection terminals 21A for electric wiring and a plurality of external connection terminals 22A for the optical circuit section, and formed on the surface o the other terminal unit 11B of the insulating board member 20 are an optical circuit section 4B, a plurality of external connection terminals 21B for electric wiring and a plurality of external connection terminals 22B for the optical circuit section.

Further, electric wirings 23 are formed on the surface of the insulating board member 20 to connect between the external connection terminals 21A and 21B. The electric wirings 23 include: first electric wirings 23a formed in the wiring section 10; second electric wirings 23b formed in the terminal units 11A and 11B, which connect the external connection terminals 21A and 21B to the first electric wirings 23a; third electric wirings 23c that connect the external connection terminals 22A to the optical circuit sections 4A and 4B; and fourth electric wirings 23d for internal connections in the optical circuit sections 4A and 4B. In the wiring section 10, the first electric wirings 23a and the optical waveguide 3 are stacked. In the terminal units 11A and 11B, the second electric wirings 23b and the optical circuit sections 4A and 4B are arranged in parallel on the same plane without being stacked. That is, the optical circuit section 4A, the first electric wirings 23a and the optical circuit section 4B are arranged longitudinally in this order.

The portion of the FPC 2 where the first electric wirings 23a are formed corresponds to the first electric wiring section, the portion where the second electric wirings 23b are formed corresponds to the second electric wiring section, and the portion where the third electric wirings 23c are formed corresponds to the third electric wiring section.

For the first to third electric wirings 23a to 23c, conductive patterns such as copper wire patterns are employed, and bonding wires or conductive patterns are employed for the fourth electric wirings 23d. In FIG. 1, for convenience sake, the forth electric wirings 23d in each of the optical circuit sections 4A and 4B are represented by two lines.

The external connection terminals 21A and 21B for the electric wiring and the first and second electric wirings 23a and 23b are grounded differently from the external connection terminals 22A and 22B for the optical circuit sections 4A and 4B, so that the terminals 21A and 21B and the electric wirings 23a and 23b are electrically separated from the terminals 22A and 22B and the optical circuit sections 4A and 4B.

The external connection terminals 21A and 21B for the electric wiring and the first and second electric wirings 23a and 23b may be formed on the back surface of the insulating board member 20 (the surface opposite to the optical waveguide 3) in order to prevent noise from affecting the optical circuit sections 4A and 4B.

(Optical circuit sections)

One optical circuit section 4A includes: a light emitting element 40A and a light receiving element 41A, which are optically connected to the optical waveguide 3; a drive IC 42A that drives the light emitting element 40A; and an amplification IC 43A that amplifies a signal output by the light emitting element 41A. The other optical circuit section 4B, arranged as is the optical circuit section 4A, includes: a light emitting element 40B and a light receiving element 41B, which are optically connected to the optical waveguide 3; a drive IC 42B that drives the light emitting element 40B; and an amplification IC 43B that amplifies a signal output by the light receiving element 41B. The optical circuit sections 4A and 4B are covered with protective members not shown in the figures.

Since the bases 5A and 5B are arranged and protective members not shown in the figures are formed, the rigidity (flexural rigidity) of the terminal units 11A and 11B is greater than is that of the wiring section 10.

The external connection terminals 22A for the optical circuit sections and the external connection terminals 21A for the electric wiring are aligned so that they may be connected into a single connector.

A surface optical element such as a surface emitting diode or a surface emitting laser can be employed for the light emitting elements 40A and 40B. Thus, in this embodiment, VCSELs (surface emitting lasers) having electrodes on the upper and lower surfaces are employed for the light emitting elements 40A and 40B. Surface optical elements such as surface photodiodes can be employed for the light receiving elements 41A and 41B. In this embodiment, GaAs PIN photodiodes are employed as the light receiving elements 41A and 41B.

The optical circuit sections 4A and 4B may include other circuits, in addition to the drive ICs 42A and 42B and the amplification ICs 43A and 43B. Further, the optical circuit section 4A may include one or two or more light emitting elements 40A and drive ICs 42A, and the other optical circuit section 4B may include one or two or more light receiving elements 41A and amplification ICs 43A. In addition, the drive ICs 42A and 42B or the amplification ICs 43A and 43B of the optical circuit sections 4A and 4B may be arranged outside the optoelectric composite wiring module 1.

(Optical waveguide)

The optical waveguide 3 is, for example, a macromolecular optical waveguide, and includes, for example, two cores 30 (optical wiring) having a thickness of 50 μm and a width of 50 μm; cladding 31 formed around the cores 30; and mirror planes 32A and 32B formed at the ends of the optical waveguide in the longitudinal direction of the core 30, the mirror planes having at a tilt angle of 45 degrees. The cross sectional shape of the cores 30 may be longer in the direction of the thickness of the optical wavelength 3 than in the direction of the width, e.g., may have a height of 50 μm and a width of 100 μm so as to be easily positioned with respect to the light emitting portions 40a of the light emitting elements 40A and 40B and the light receiving portions 41a of the light receiving elements 41A and 41B.

The mirror planes 32A and 32B can be obtained by dicing processing or laser processing. When the areas surrounding the mirror planes 32A and 32B are to be covered by protective members, films of a metal such as aluminum are deposited on the mirror planes 32A and 32B in order to increase the reflection efficiency.

(Method for manufacturing an optical waveguide)

The optical waveguide 3 will be manufactured as follows. First, a master plate having a convex portion corresponding to the cores 30 is fabricated by photolithography. Then, a curing resin having a viscosity of about 500 to 7,000 mPa·s and having translucency in an ultraviolet region or a visible region, e.g., curable polyorganosiloxane containing a methylsiloxane group, an ethylsiloxane group or a phenylsiloxane group in the molecule, is coated on the surface of the master plate having the convex portions to provide a layer of the resin. Thereafter, the layer is cured to provide a cured layer. Following this, the cured layer is peeled off the master plate to prepare a mold in which recessed portion corresponding to the convex portions are formed.

Next, a cladding film base member of a resin that is superior in adhesion, e.g., an alicyclic acrylic resin film, an alicyclic olefin resin film, a cellulose triacetate film, or a fluorocarbon resin film, is adhered to this mold. Then, sequentially, the recessed portions of the mold are filled with a curing resin, such as an ultraviolet curing or thermosetting monomer or oligomer, a mixture thereof, or a curing resin including an epoxy, polyimide or acrylic ultraviolet curing resin. And following this, the curing resin in the recessed portions is cured to form the cores 30, and the mold is removed. As a result, the cores 30 remain in the cladding film base member.

Next, a clad layer is formed on the surface where the cores 30 of the cladding film base member have been formed, so that the cores 30 are covered. In this case, a layer obtained by coating and curing a film or clad curing resin, or a macromolecular film obtained by coating and drying a solution of a macromolecular material can be employed as a cladding layer.

Finally, the surfaces where the cores 30 of the optical waveguide 3 are to be exposed are cut at an angle to form the mirror planes 32A and 32B. Further, the cores 30 are cut out in parallel, using a dicer, and the optical waveguide 3 is completed where the cladding film base member and the cladding layer are employed as the cladding 31.

(Flexibility of an optoelectric composite wiring module)

Figure 4A:
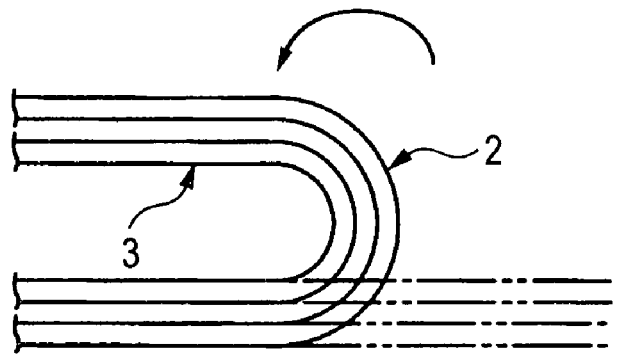
FIGS. 4A to 4C are diagrams for explaining the flexibility of the optoelectric composite wiring module according to the first exemplary embodiment.
Figure 4B:
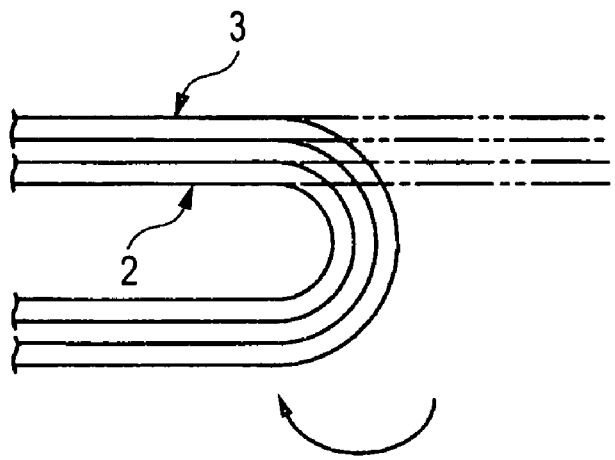
Figure 4C:
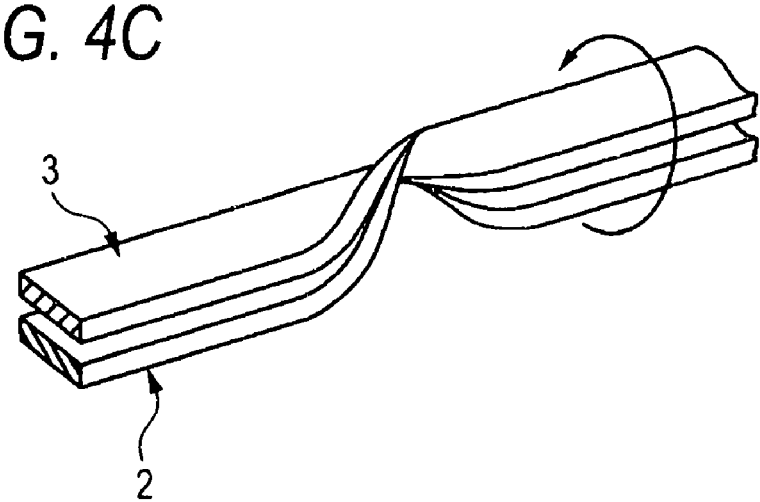

FIGS. 4A to 4C are diagrams for explaining the flexibility of the optoelectric composite wiring module 1. The FPC 2 has a flexibility that permits bending in the direction of the thickness and twisting. Since the optical waveguide 3 is an optical waveguide made of a polymer, the optical waveguide 3 has a flexibility that permits bending and twisting in every direction. The FPC 2 and the optical waveguide 3 corresponding to the wiring section 10 are not physically adhered to each other and are separated. Therefore, the entire wiring section 10 has a flexibility that permits bending in the direction of the thickness as shown in FIGS. 4A and 4B and also permits twisting as shown in FIG. 4C.

The terminal unit 11A or 11B of the FPC 2 can be bent between the optical circuit section 4A and the external connection terminals 21A and 21B, or 22A and 22B. When one of these portions is bent, wiring can be performed in an area such as the hollow portion of a hinge, which is smaller than the width of the optoelectric composite wiring module 1.

Second Embodiment

Figure 5:
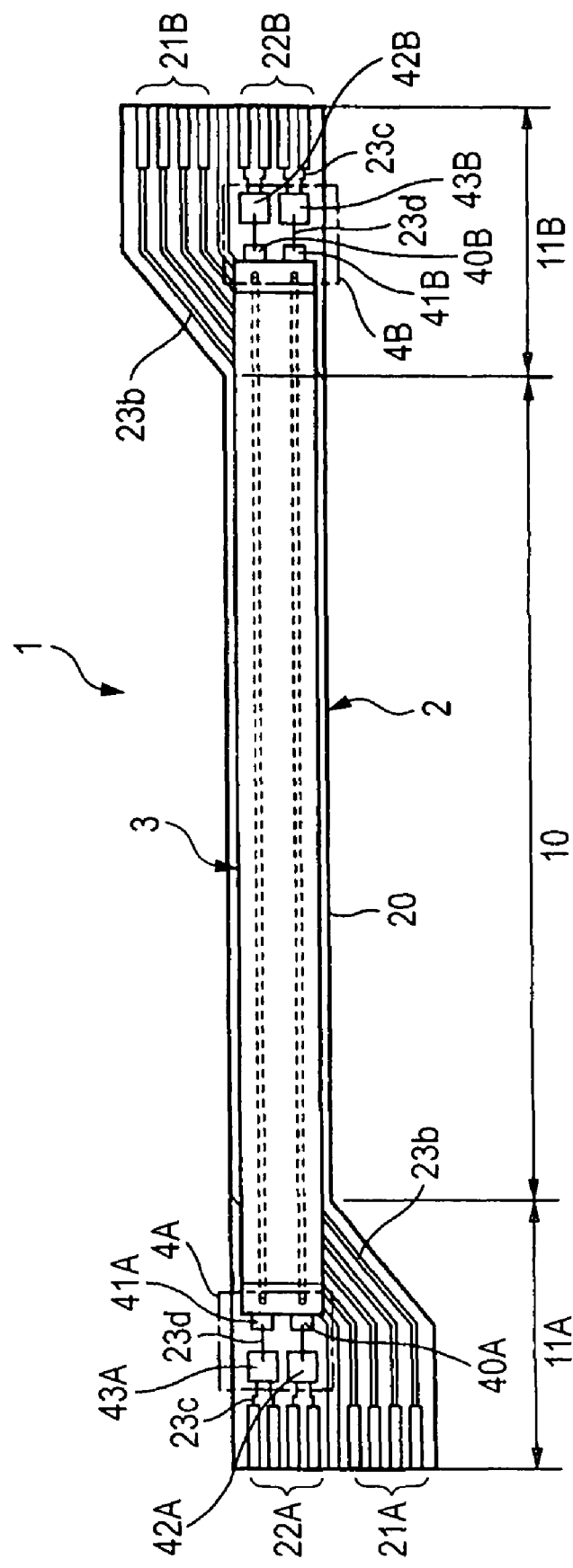
FIG. 5 is a plan view of an optoelectric composite wiring module according to a second exemplary embodiment of the present invention.
Figure 6:
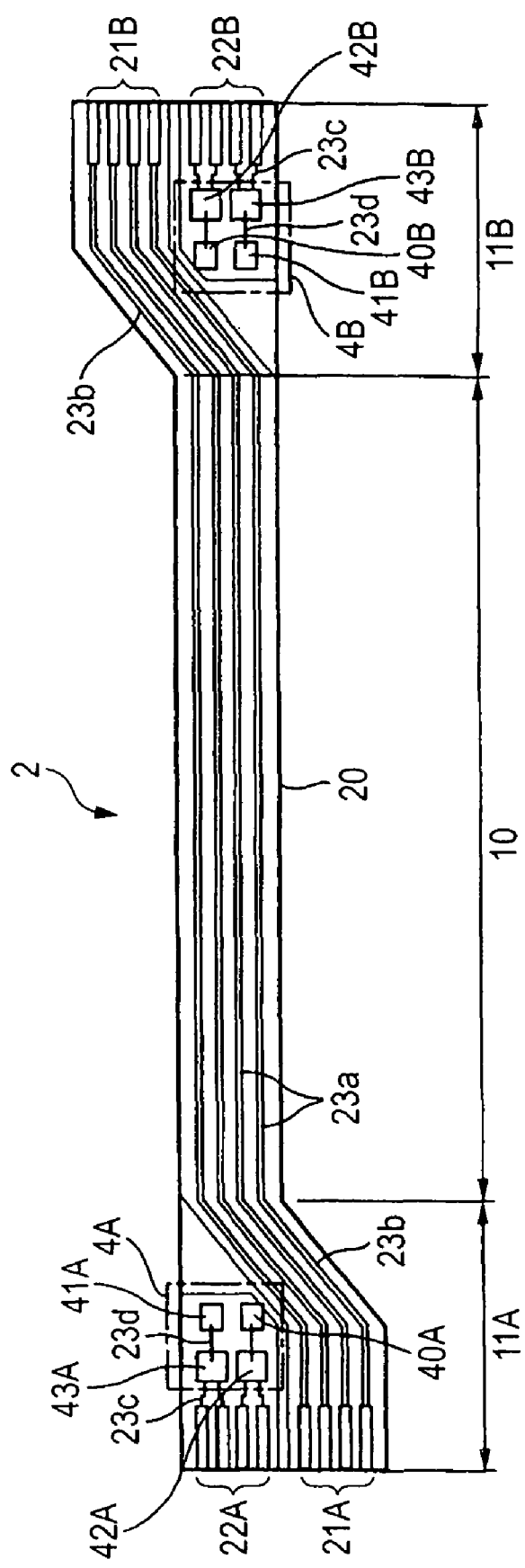
FIG. 6 is a plan view of the optoelectric composite wiring module shown in FIG. 5, without an optical waveguide.

FIG. 5 is a plan view of a optoelectric composite wiring module according to a second exemplary embodiment of the present invention. FIG. 6 is a plan view of the optoelectric composite wiring module in FIG. 5 without the optical waveguide. In the first embodiment, the external connection terminals 21A and 21B for electric wiring and the external connection terminals 22A and 22B for optical circuit sections were arranged in the longitudinal direction of the wiring section 10. In this embodiment, external connection terminals 21A and 21B for electric wiring, and external connection terminals 22A and 22B for optical circuit sections are perpendicularly arranged in the longitudinal direction of the wiring section. The remainder of the structure is the same as in the first embodiment.

In this embodiment, the external connection terminal 22A for an optical circuit section, the optical waveguide 3 and the other external connection terminal 22B for an optical circuit section are linearly arranged.

The external connection terminals 21A, 21B, 22A and 22B are vertically arranged relative to the longitudinal direction of the wiring section 10, and since the wiring section 10 is flexible, the structure can be deformed and passed through the hollow portion of a hinge.

When reinforcement is required for the external connection terminals 21A, 21B, 22A and 22B, the flexibility required for the structure to be passed through the hollow portion of a hinge is limited during the assembly process. Therefore, the flexural rigidity of the external connection terminals 22A and 22B and the external connection terminals 21A and 21B need only be reduced, for example, by heating to obtain flexibility.

Third Embodiment

Figure 7:
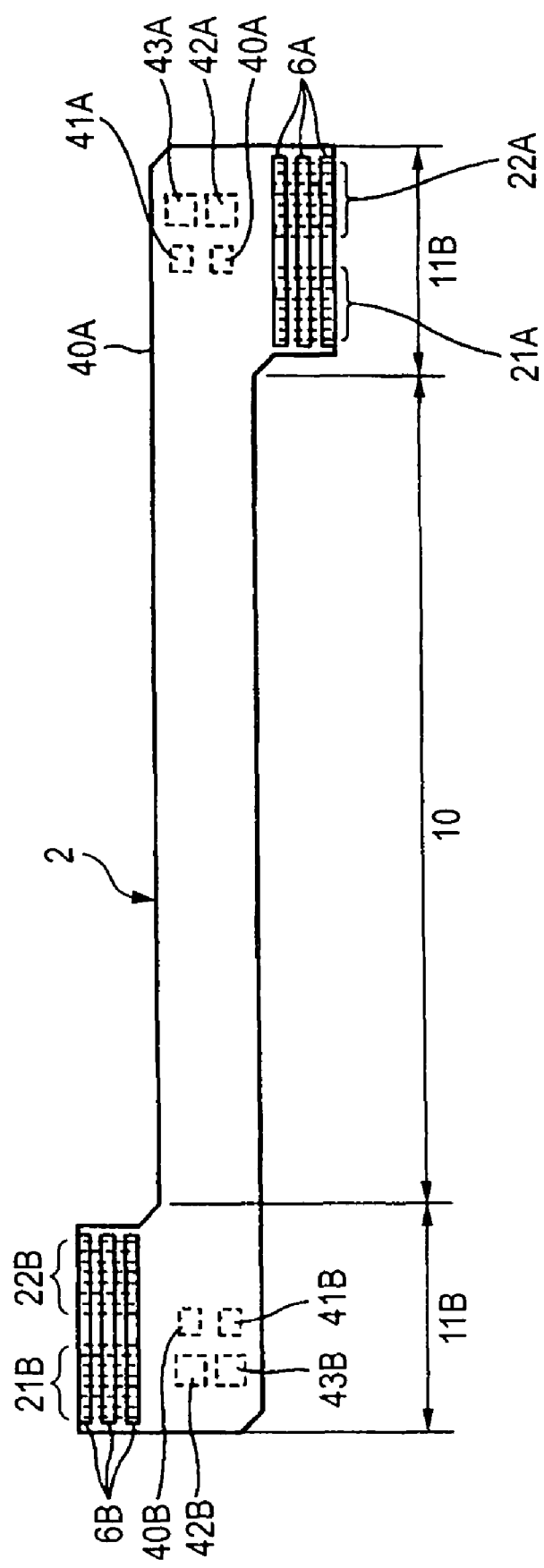
FIG. 7 is a plan view of the back surface of a flexible printed wiring board according to a third exemplary embodiment of the invention.

FIG. 7 is a plan view of the back surface of a flexible printed wiring board according to a third exemplary embodiment of the present invention. According to this embodiment, a plurality of reinforcement members 6A and 6B are provided for the back surface of the terminal units 11A and 11B of the FPC 2 for the first embodiment.

That is, the reinforcement member sets 6A and 6B, three members in each set, are arranged in parallel to the longitudinal direction of the wiring section 10, on the portions of the back surfaces of the terminal units 11A and 11B of the FPC 2, corresponding to the external connection terminals 21A, 21B, 22A and 22B, so that appropriate connections can be obtained with the connectors, and the terminals 11A and 11B can be easily bent around an axis of the longitudinal direction of the wiring section 10.

Fourth Embodiment

Figure 8:
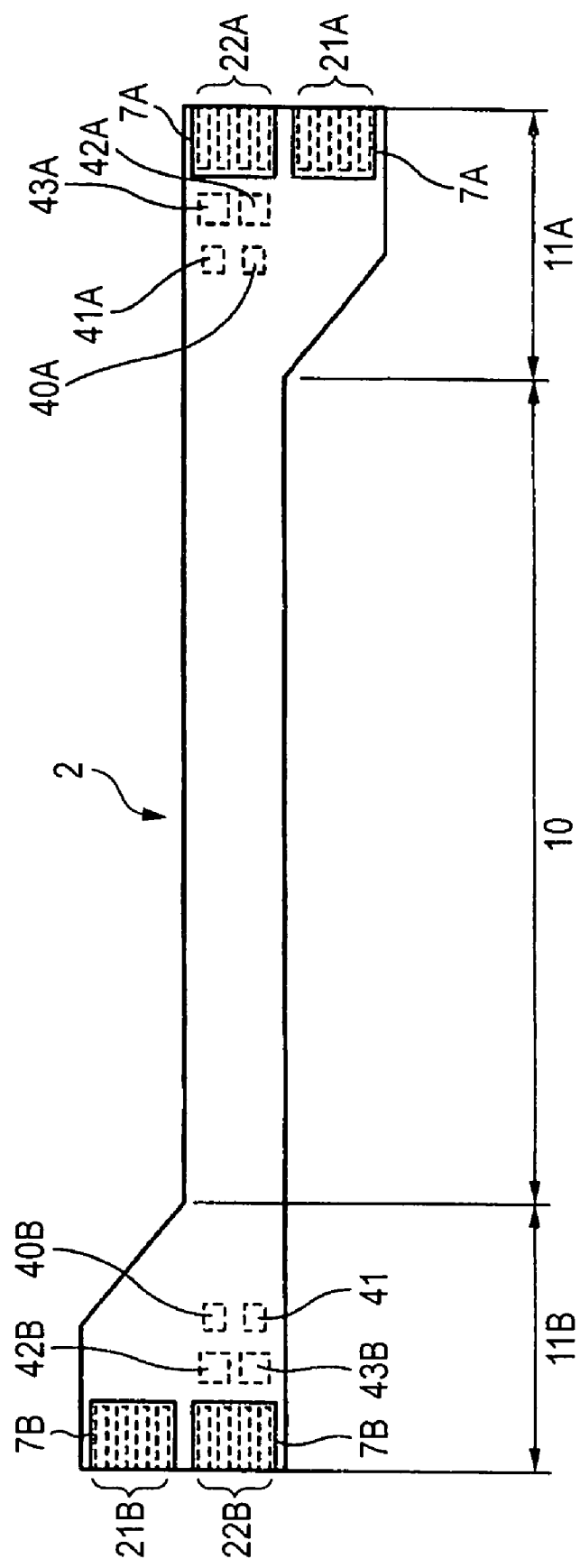
FIG. 8 is a plan view of the back surface of a flexible printed wiring board according to a fourth exemplary embodiment of the invention.

FIG. 8 is a plan view of the back surface of a flexible printed wiring board according to a fourth exemplary embodiment of the present invention. According to this embodiment, a plurality of reinforcement members 7A and 7B are provided for the back surface of the terminal units 11A and 11B of the FPC 2 for the second embodiment.

That is, the reinforcement member sets 6A and 6B, two in a set, are arranged in parallel to the longitudinal direction of the wiring section 10 and corresponding to the external connection terminals 21A and 21B for electric wirings and the external connection terminals 22A and 22B for optical circuit sections, on the portions of the back surfaces of the terminal units 11A and 11B of the FPC 2, corresponding to the external connection terminals 21A, 21B, 22A and 22B. As a result, appropriate connections with the connectors can be obtained, and the terminals 11A and 11B can be easily bent around an axis of the longitudinal direction of the wiring section 10.

As in the third and fourth embodiments, after wiring for the optoelectric composite wiring module 1 for the first or the second embodiment has been completed in a narrow area, such as the hollow portion of a hinge, reinforcement members may be provided for the terminal units 11A and 11B.

Fifth Embodiment

Figure 9C:
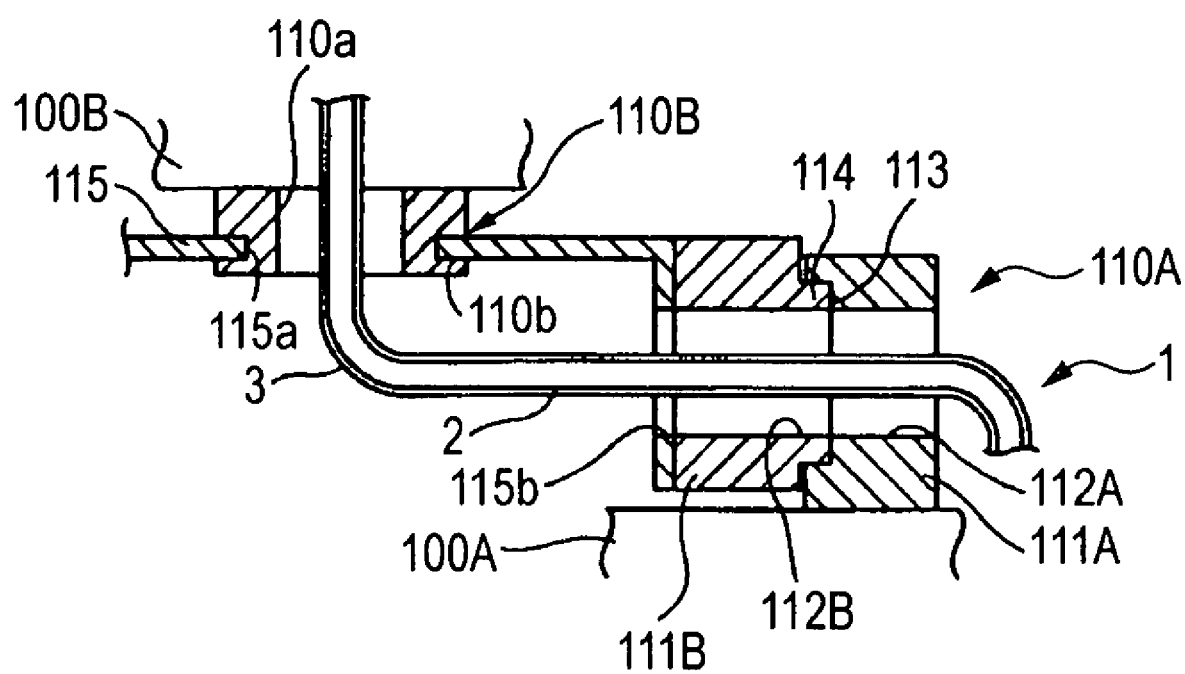
FIG. 9C is a detailed cross-sectional view of the hinge portion of the cellular phone.

FIGS. 9A-9C are diagrams showing a cellular phone, for which an information processing apparatus according to a fifth exemplary embodiment of the present invention is applied. That is, FIG. 9A is a front view of the cellular phone, and FIG. 9B is a rear view. And FIG. 9C is a detailed cross-sectional view of the hinge portion.

As shown in FIG. 9A, a cellular phone 100 includes: a first case 100A that includes an operating button section 101; a second case 100B that includes a liquid crystal display 102 and a camera (not shown); a first hinge 110A that couples the second case 100B with the first case 100A, so that the second case 100B can be opened and closed at a first rotation axis $R_1$; and a second hinge 110B that couples the first case 100A with the second case 100B, so that the first case 100A can be rotated at a second rotation axis $R_2$.

Further, as shown in FIG. 9B, the cellular phone 100 also includes: a first board 103A that is provided on the back surface of the operating button section 101; a second board 103B that is provided on the back surface of the liquid crystal display 102; first and second connectors 104A and 104B that are provided for the first and second boards 103A and 103B, respectively; an optoelectric composite wiring module 1 according to the first embodiment, which connects between the first and second connectors 104A and 104B; a first cover 105A that covers the entire back surface of the operating button section 101; and a second cover 105B that covers the entire back surface of the liquid crystal display unit 102. The optoelectric composite wiring module 1 for one of the second to the fourth embodiments may be employed.

As shown in FIGS. 9A, 9B and 9C, the first hinge 110A includes first and second hinge cylinders 111A and 111B located on the left and right of the firs hinge, respectively. The first hinge cylinder 111A is fixed to the first case 100A, and the second hinge cylinder 111B is fixed to the second case 100B by a hinge fitting member 115 and the second hinge 110B. As shown in FIG. 9B, a concave coupling portion 113 is formed in the first hinge cylinder 111A, while a convex coupling portion 114 is formed on the second hinge cylinder 111B, and these portions 113 and 114 are coupled together and are rotatable. Furthermore, in the first and second hinge cylinders 111A and 111B, through holes 112A and 112B are formed, into which the optoelectric composite wiring module 1 can be inserted.

An opening 115a is formed in the center of the hinge fitting member 115 that is bent into a U shape, and an opening 115b is formed in both upright ends of the center portion.

The second hinge 110B has a cylindrical shape, through which a through hole 110a is formed. Further, a groove 110b is formed in the second hinge 110B to engage the opening 115a of the hinge fitting member 115, and with this groove 110b, the second hinge 110B is fixed to the second case 100B.

FIGS. 10A and 10B are diagrams for explaining a method for inserting the optoelectric composite wiring module 1 into the through holes 112A and 112B of the first and second hinge cylinders 111A and 111B. The example in FIG. 10A is a case wherein the optoelectric composite wiring module 1 of the first embodiment, which does not include a reinforcement member, is employed, and the example shown in FIG. 10B is a case wherein the optoelectric composite wiring module 1 of the third embodiment is employed.

An example size for the optoelectric composite wiring module 1 is shown as follows.
(1) wiring section 10 of the FPC 2: about 2 mm wide
(2) terminal units 11A and 11B of the FPC 2: about 4 mm wide
(3) optical waveguide 3: about 1.5 mm wide When about 3 mm is the size defined for the through holes 112A and 112B, of the first and second hinge cylinders 111A and 111B of the first hinge 110A, and the through hole 110a of the second hinge 110B, the optoelectric composite wiring module 1 having the above described size is inserted into the first and second hinge cylinders 111A and 111B by rolling the terminal units 11A and 11B around the axis of the longitudinal direction of the wiring section 10, as shown in FIGS. 10A and 10B. Further, the wiring section 10 of the FPC 2, with an inner radius of about 2 mm, is bent in the direction of the thickness.

(Operation of a Cellular Phone)

The operation of the cellular phone 100 will now be described. When a user manipulates the operating button section 101, power or an electric signal for control is transmitted from the first board 103A through the first connector 104A to the external connection terminal 21A, used for electric wiring, of the optoelectric composite wiring module 1. The power or the electric signal received at the external connection terminal 21A is transmitted to the electric wiring 23 and the other external connection terminal 21B, and to the second board 103B, through the second connector 104B of the liquid crystal display unit 102.

When a transmission instruction signal such as an image signal is transmitted from the first board 103A through the first connector 104A to the external connection terminal 21A for an optical circuit section, of the optoelectric composite wiring module 1, the drive IC 42A of the optical circuit section 4A drives the light emitting element 40A based on the transmission instruction signal, and permits the light emitting portion 40a to generate an optical signal. The optical signal generated by the light emitting portion 40a enters one end of the optical waveguide 3, is reflected by the mirror plane 32A, is fully reflected inside the core 30, and is transmitted to the other side. The optical signal transmitted to the other side is reflected by the mirror plane 32B, and is thereafter received by the light receiving portion 41a of the light receiving element 41B of the optical circuit section 4B, and the reflected signal is converted into an electric signal. This electric signal is amplified by the amplification IC 43B, and the amplified signal is output by the external connection terminal 22B for an optical circuit section, through the second connector 104B to the second board 103B. Through this processing, an image is displayed on the liquid crystal display 102.

When the user has manipulated the operating button 101 and has photographed pictures using a camera, an image signal obtained by the camera is transmitted from the second board 103B through the second connector 104B to the external connection terminal 21B for an optical circuitry, of the optoelectric composite wiring module 1. Then, in the same manner as described above, the drive IC 42B of the optical circuit section 4B permits the light emitting element 40B to generate an optical signal. The optical signal passes through the mirror plane 32B, the core 30 and the mirror plane 32A, enters the light receiving element 41A of the optical circuit section 4A, and is converted into an electric signal. The electric signal is amplified by the amplification IC 43A, and the amplified signal is output by the other external connection terminal 22A, through the first connector 104A, to the first board 103A.

The optical circuit sections 4A and 4B and the first and second electric wirings 23a and 23b are formed in electrically different areas. Further, when the light emitting elements 40A and 40B of the optical circuit sections 4A and 4B are driven by the drive ICs 42A and 42B, noise is generated around the drive ICs 42A and 42B; however, it is hard for this noise to be electromagnetically coupled with the first and second electric wirings 23a and 23b.

When the second case 100B is opened or closed, relative to the first case 100A, at the first hinge 100A, the optoelectric composite wiring module 1 is bent or twisted as the second case 100B is open or closed. Further, when the second case 100B is rotated, relative to the first case 100A, at the second hinge 110B, the optoelectric composite wiring module 1 is twisted as the second case 100B is rotated.

In this embodiment, the optoelectric composite wiring module 1 has been applied for a cellular phone. However, the optoelectric composite wiring module 1 can also be applied for an information processing apparatus, such as a personal computer or a portable terminal. Further, the optoelectric composite wiring module of this invention can also be applied for a cellular phone that does not include the second hinge 110B.

Sixth Embodiment

Figure 11:
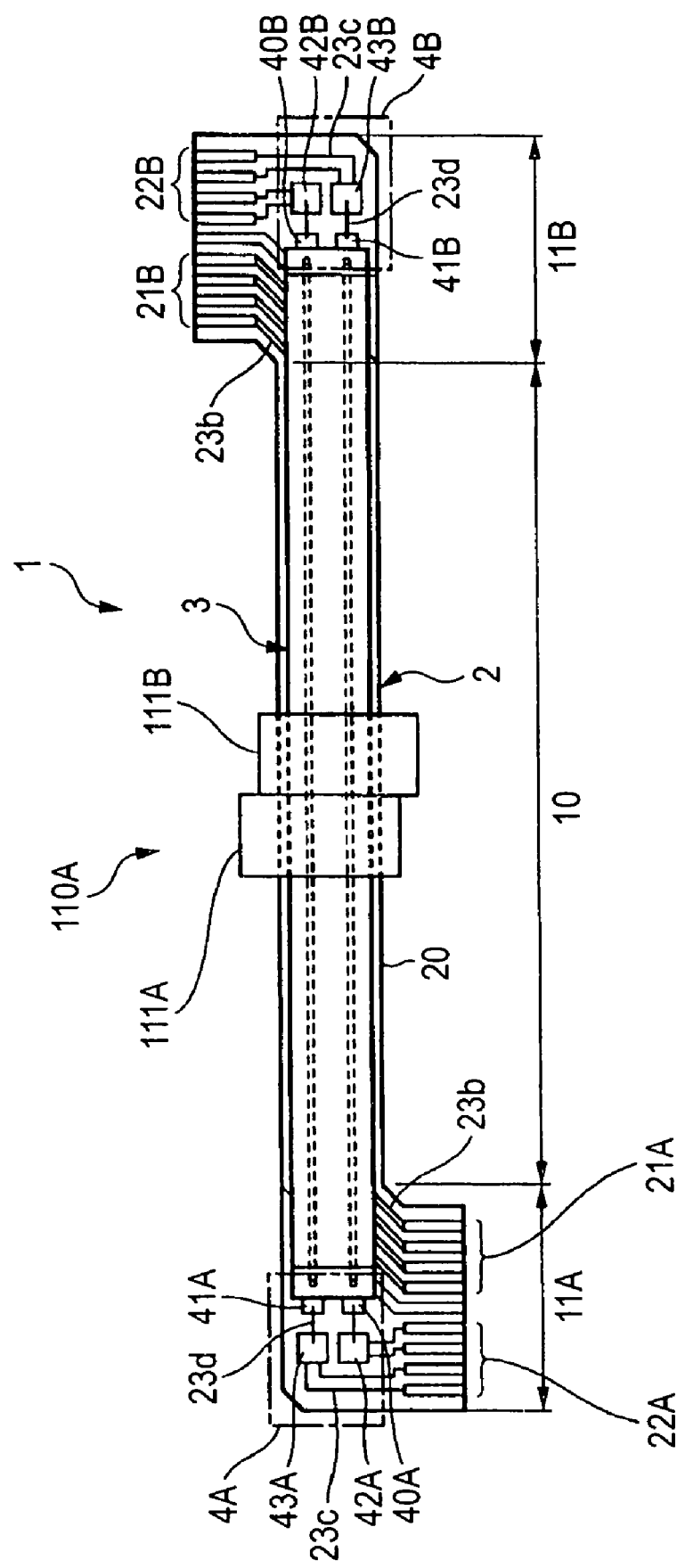
FIG. 11 is a plan view of an optoelectric composite wiring module according to a sixth exemplary embodiment of the present invention.

FIG. 11 is a plan view of an optoelectric composite wiring module 1 according to a sixth exemplary embodiment of the present invention. In this embodiment, a first hinge 110A is assembled that has the structure of the first embodiment. The optoelectric composite wiring module 1 is inserted through through holes 112A and 112B of the first hinge 110A, and thereafter, the first hinge 110A is attached to an apparatus, such as a cellular phone 100. The first hinge 110A may be assembled with one of the optoelectric composite wiring modules 1 in the second to the fourth embodiments. Further, the first and second hinges 110A and 110B may be assembled with the optoelectric composite wiring module 1, or only the second hinge 110B may be assembled.

Seventh Embodiment

Figure 12:
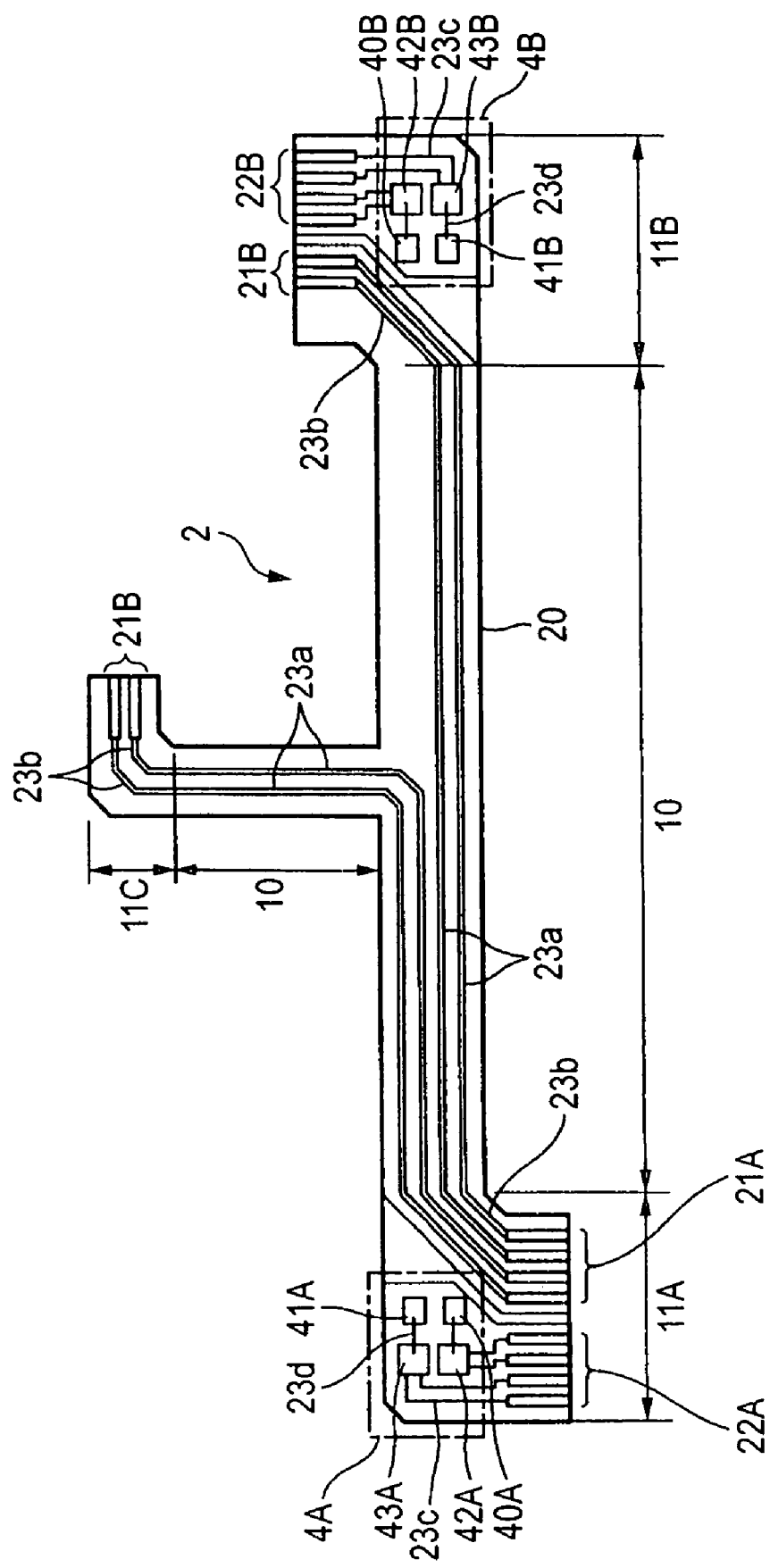
FIG. 12 is a plan view of a flexible printed wiring board for an optoelectric composite wiring module according to a seventh exemplary embodiment of the present invention.

FIG. 12 is a plan view of a flexible printed wiring card for an optoelectric composite wiring module according to a seventh exemplary embodiment of the present invention. For a flexible printed wiring card 2, a third terminal unit 11C is provided in addition to the pair of terminal units (first and second terminal units) 11A and 11B of the first embodiment. That is, part of the external connection terminal 21B, used for electric wiring, of the terminal unit 11B in the first embodiment is arranged in the third terminal unit 11C, and an electric wiring 23a, which extends from the external connection terminal 21A of the first terminal unit 11A to the external connection terminal 21B, is branched into the second terminal unit 11B and the third terminal unit 11C for connections.

Other Embodiments

The present invention is not limited to these embodiments, and can be variously modified and carried out without departing from the subject of the invention. Furthermore, the components of the individual embodiments can be arbitrarily combined without departing from the subject of the invention.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An optoelectric composite wiring module comprising:
a wiring section that is configured so that an optical wiring section including an optical wiring and a first electric wiring section are laminated;
a pair of terminal sections that are provided on both ends of the wiring section and that include an optical-wiring-assigned external connection terminal and an electric-wiring-assigned external connection terminal wherein the electric-wiring assigned external connection terminal is disposed in a non-collinear arrangement with respect to the first electric wiring section;
a pair of optical circuit sections that are provided on the pair of terminal sections and that include an optical element that is optically connected to the optical wiring by performing a photoelectric conversion and by inputting/outputting an optical signal;
a second electric wiring section that is provided on the pair of terminal sections and that electrically connects the first electric wiring section of the wiring section and the electric-wiring-assigned external connection terminal; and
a third electric wiring section that is provided on the pair of terminal sections and that electrically connects the optical circuit and the optical-wiring-assigned external connection terminal;
the optical-wiring-assigned external connection terminal and the electric-wiring-assigned external connection terminal being aligned in a single line.

2. The optoelectric composite wiring module according to claim 1, wherein at least a part corresponding to the optical wiring section and to the first electric wiring section laminated on the optical wiring section has a flexibility.

3. The optoelectric composite wiring module according to claim 1, wherein a part corresponding to the optical wiring section and to the first electric wiring section laminated on the optical wiring section is laminated through a gap.

4. The optoelectric composite wiring module according to claim 1, wherein the optical circuit section and the first and second electric wiring sections are electrically separated.

5. The optoelectric composite wiring module according to claim 1, wherein the optical wiring section and the pair of optical circuit sections are disposed in a straight line manner.

6. The optoelectric composite wiring module according to claim 1, wherein the optical wiring section, the optical-wiring-assigned external connection terminal and the pair of optical circuit sections are disposed in a straight line manner.

7. The optoelectric composite wiring module according to claim 1, wherein the optical-wiring-assigned external connection terminal and the electric-wiring-assigned external connection terminal are arranged in a longitudinal direction of the wiring section.

8. The optoelectric composite wiring module according to claim 1, wherein the optical-wiring-assigned external connection terminal and the electric-wiring -assigned external connection terminal are arranged in a direction perpendicular to a longitudinal direction of the wiring section.

9. The optoelectric composite wiring module according to claim 1, wherein the pair of terminal sections include a plurality of reinforcement members that are disposed in parallel with a longitudinal direction of the wiring section at a part corresponding to the optical-wiring-assigned external connection terminal and the electric-wiring-assigned external connection terminal.

10. The optoelectric composite wiring module according to claim 1, wherein the terminal section includes a flexible section at least between the optical circuit section and the external connection terminal.

11. An information processing apparatus comprising:
a first case including at least an operation button section;
a second case including at least a display section;
a hinge coupling the first case and the second case; and
the optoelectric composite wiring module according to claim 1, the optoelectric composite wiring module transmitting a signal between the first case and the second case.

12. An optoelectric composite wiring module comprising:
a wiring section that is configured so that an optical wiring section including an optical wiring and a first electric wiring section are laminated;
first and second terminal sections that are provided on both ends of the wiring section and that include an optical-wiring-assigned external connection terminal and an electric-wiring-assigned external connection terminal wherein the electric-wiring assigned external connection terminal is disposed in a non-collinear arrangement with respect to the first electric wiring section;
a third terminal section that is formed so as to be bifurcated from the first electric wiring section and that includes an electric-wiring-assigned external connection terminal connected to the electric-wiring-assigned external connection terminal of the first or second terminal section by an electric wiring;
a pair of optical circuit sections that are provided on the first and second terminal sections and that include an optical element that is optically connected to the optical wiring by performing a photoelectric conversion and by inputting/outputting an optical signal;
a second electric wiring section that is provided on the first and second terminal sections and that electrically connects the electric wiring of the wiring section and the electric-wiring-assigned external connection terminal; and
a third electric wiring section that is provided on the first and second terminal sections and that electrically connects the optical circuit and the optical-wiring-assigned external connection terminal;
the optical-wiring-assigned external connection terminal and the electric-wiring-assigned external connection terminal being aligned in a single line.

* * * * *